United States Patent
Bae et al.

(10) Patent No.: US 9,419,736 B2
(45) Date of Patent: Aug. 16, 2016

(54) LOW-POWER CML-LESS TRANSMITTER ARCHITECTURE

(71) Applicants: Korea Advanced Institute of Science and Technology, Daejeon (KR); TeraSquare Co., Ltd., Seoul (KR)

(72) Inventors: Hyeon Min Bae, Seoul (KR); Tae Hun Yoon, Daejeon (KR); Jin Ho Park, Seoul (KR); Tae Ho Kim, Daejeon (KR)

(73) Assignee: GigOptix-TeraSquare Korea Co., Ltd., Seoul (KR)

( * ) Notice: Subject to any disclaimer, the term of this patent is extended or adjusted under 35 U.S.C. 154(b) by 31 days.

(21) Appl. No.: 13/835,530

(22) Filed: Mar. 15, 2013

(65) Prior Publication Data

US 2014/0269761 A1 Sep. 18, 2014

(51) Int. Cl.
*H04J 3/04* (2006.01)
*H03K 19/173* (2006.01)
*H04L 25/02* (2006.01)

(52) U.S. Cl.
CPC .............. *H04J 3/04* (2013.01); *H03K 19/1737* (2013.01); *H04L 25/0286* (2013.01)

(58) Field of Classification Search
CPC ...... H03K 5/1565; H04L 25/0286; H04J 3/04
USPC ......................................................... 370/464
See application file for complete search history.

(56) References Cited

U.S. PATENT DOCUMENTS

| | | | | |
|---|---|---|---|---|
| 2001/0017866 A1* | 8/2001 | Takada | ............... | H04Q 11/0003 370/535 |
| 2004/0057564 A1* | 3/2004 | Rappaport | ............ | H04L 5/0048 379/93.01 |
| 2004/0086002 A1* | 5/2004 | Dally | ..................... | H04J 3/047 370/539 |
| 2004/0136344 A1* | 7/2004 | Kim | ..................... | H04B 7/2628 370/335 |
| 2005/0157802 A1* | 7/2005 | Park | .................... | H04L 27/2607 375/260 |
| 2005/0271152 A1* | 12/2005 | Kim | .................... | H04L 27/2634 375/260 |

(Continued)

FOREIGN PATENT DOCUMENTS

CN 1956427 A 5/2007
CN 1992578 A 7/2007

(Continued)

OTHER PUBLICATIONS

Chiba et al., A 5-6.4-Gb/s 12-Channell Transceiver With Pre-Emphasis and Equalization, Journal of Solid-State Circuits, vol. 40, 978-985 (2005).

(Continued)

*Primary Examiner* — Asad Nawaz
*Assistant Examiner* — Syed S Ali
(74) *Attorney, Agent, or Firm* — Marshall, Gerstein & Borun LLP

(57) ABSTRACT

Exemplary embodiments of the present invention relate to a low-power current mode logic (CML)-less transmitter architecture. A transmitter comprises a main multiplexer configured to generate a main data signal by multiplexing parallel main data signals retimed from a retimer for time margin between parallel input data signals and a multiphase clock signals from a clock distributor, a secondary multiplexer configured to generate a post data signal by multiplexing parallel post data signals retimed from the retimer, and a plurality of output drivers configured to generate a serial data signal by summing the main data signal and the post data signal.

7 Claims, 4 Drawing Sheets

(56) References Cited

U.S. PATENT DOCUMENTS

| | | | |
|---|---|---|---|
| 2005/0280445 A1* | 12/2005 | Forbes | H03K 19/0963 326/96 |
| 2006/0133429 A1* | 6/2006 | Seo | H04N 21/434 370/535 |
| 2006/0192603 A1 | 8/2006 | Nguyen | |
| 2007/0103186 A1 | 5/2007 | Clements et al. | |
| 2009/0307540 A1* | 12/2009 | Razazian | H04B 3/143 714/701 |
| 2010/0097942 A1* | 4/2010 | Cole | G06F 11/221 370/248 |
| 2012/0007653 A1* | 1/2012 | Choo | H03K 5/15093 327/400 |
| 2012/0087658 A1 | 4/2012 | Jander | |
| 2013/0002300 A1 | 1/2013 | Fiedler | |
| 2014/0062559 A1* | 3/2014 | Gonzalez | H03K 5/1565 327/175 |

FOREIGN PATENT DOCUMENTS

| | | |
|---|---|---|
| CN | 101201809 A | 6/2008 |
| CN | 101394377 A | 3/2009 |

OTHER PUBLICATIONS

European Search Report in corresponding European Application No. 13197588, mailed Apr. 15, 2014.

Office Action, Chinese Patent Application No. 2016042001206860, dated Apr. 25, 2016.

* cited by examiner

LOW-POWER CML-LESS TRANSMITTER ARCHITECTURE

BACKGROUND OF THE INVENTION

1. Field of the Invention

Exemplary embodiments of the present invention relate to a low-power current mode logic (CML)-less transmitter architecture.

2. Discussion of the Background

Current mode logic (CML) circuits are commonly used in high speed applications operating in the GHz frequency range. CML circuits are the physical layer used in DVI and HDMI video links, and may be frequently used in interfaces to fiber optic components. This technology has widely been used in design of high-speed integrated systems, such as in telecommunication systems (serial data transceivers, frequency synthesizers, etc.). In these circuits, to reduce the storage time, caused by the presence of minority carriers, the transistors are usually not allowed to operate in hard saturation. Storage time, which is the time before an "ON" transistor starts to turn "OFF", tends to decrease the speed of the circuit. In CML circuits a constant current is maintained in the emitter legs of the transistors with current switching from one transistor leg to another depending on the states of the input signals.

SUMMARY OF THE INVENTION

An exemplary embodiment of the present invention discloses a transmitter comprises a main multiplexer configured to generate a main data signal by multiplexing parallel signals, a secondary multiplexer configured to generate a post data signal by multiplexing the parallel signals and a plurality of output drivers configured to generate a pre-emphasized signal by summing the main data signal and the post data signal.

The plurality of output drivers include a main driver connected to an output of the main multiplexer directly and a post driver connected to an output of the secondary multiplexer directly.

The transmitter further comprises a multiplexer configured to generate the parallel signals for the main multiplexer and the secondary multiplexer by multiplexing parallel input data signals.

The transmitter further comprises a retimer configured to process retiming the parallel signals generated by the multiplexer for providing a timing margin between the parallel signals and multiphase clock signals from a clock distributor.

The multiplexer comprises a plurality of 5:1 multiplexers and a plurality of 2:1 multiplexers.

The main multiplexer comprises a plurality of cascaded N-channel metal oxide semiconductor (NMOS) transistors and adjustable pseudo P-channel metal oxide semiconductor (pseudo-PMOS) loads.

The cascaded NMOS transistors are driven by differential input data and two neighboring quarter phase clock signals among the multiphase clock signals.

The main data signal is outputted by the main multiplexer when the two neighboring quarter phase clock signals overlap.

A size of the cascaded NMOS transistors is determined based on required pre-emphasis tap weights for the channel loss compensation.

The secondary multiplexer comprises a plurality of cascaded N-channel metal oxide semiconductor (NMOS) transistors, and a size of the cascaded NMOS transistors of the secondary multiplexer is smaller than the size of the cascaded NMOS transistors of the main multiplexer.

An amount of pre-emphasis is controlled by adjusting the bias current of a post driver included in the plurality of output drivers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED OF THE ILLUSTRATED EMBODIMENTS

Figure 1:
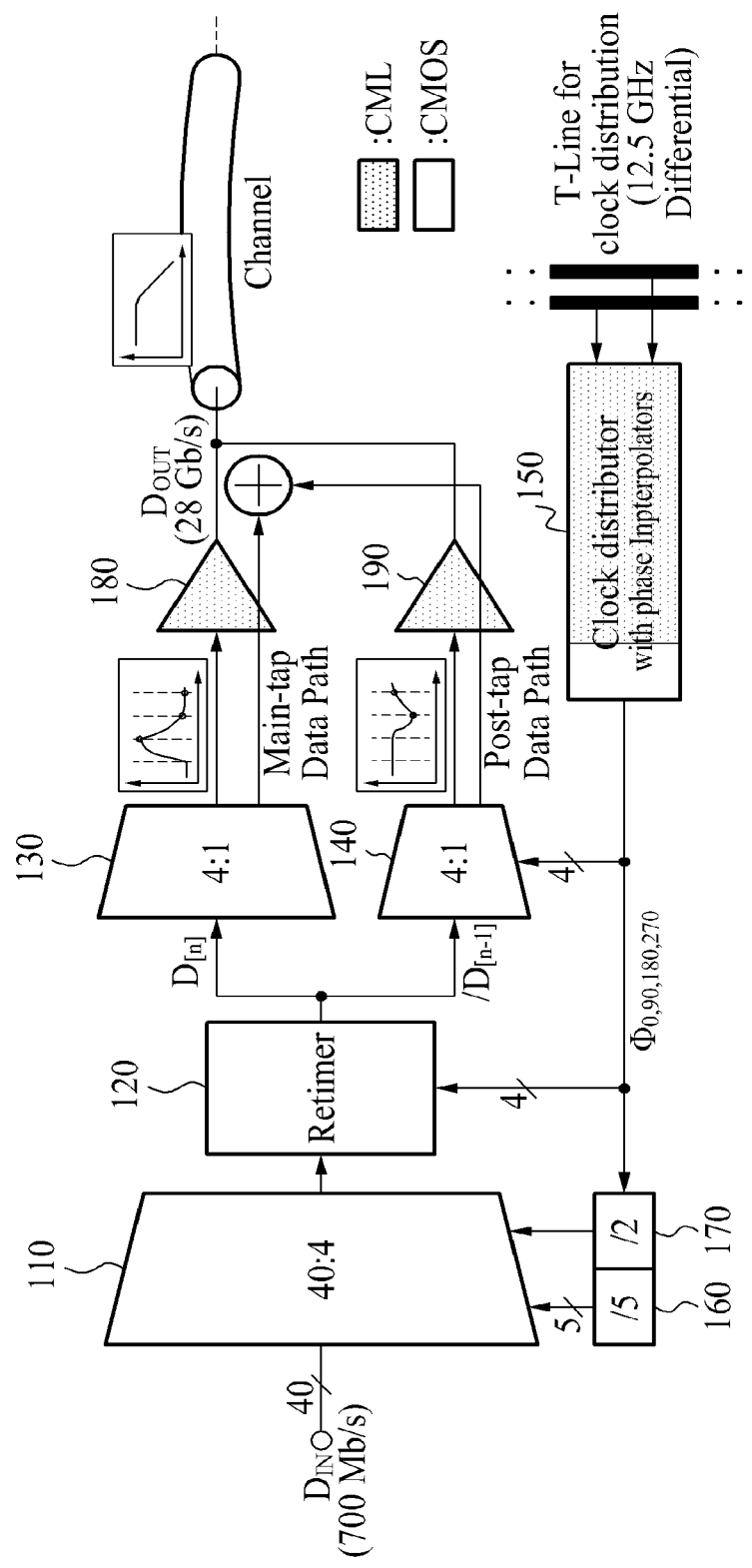
FIG. 1 is a view illustrating an example of a block diagram of a low-power current mode logic (CML)-less transmitter according to an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Exemplary embodiments of the present invention relate to a low-power current mode logic (CML)-less transmitter architecture. In the transmitter architecture, power consumption can be reduced significantly since an entire circuit components except for the output driver operate at one quarter of the line rate. In addition, the transmitter architecture is area-efficient because no passive inductors, which occupy large area, are required for the bandwidth extension.

FIG. 1 is a view illustrating an example of a block diagram of a low-power current mode logic (CML)-less transmitter according to an exemplary embodiment of the present invention. The transmitter may include a 40:4 multiplexer 110, an interstage retimer 120 and two 4:1 multiplexers, such as main 4:1 multiplexer 130, secondary 4:1 multiplexer 140 and output drivers 180, 190. The transmitter may serialize parallel data streams to a serial data while achieving pre-emphasis for channel dispersion compensation. The 40:4 multiplexer 110 may comprise a plurality of 5:1 multiplexers and a plurality of 2:1 multiplexers. A frequency divider 170 may divide a multiphase clock signals from a clock distributor 150, by 2. And a frequency divider 160 may divide the divided multiphase clock signals, by 5.

Figure 2:
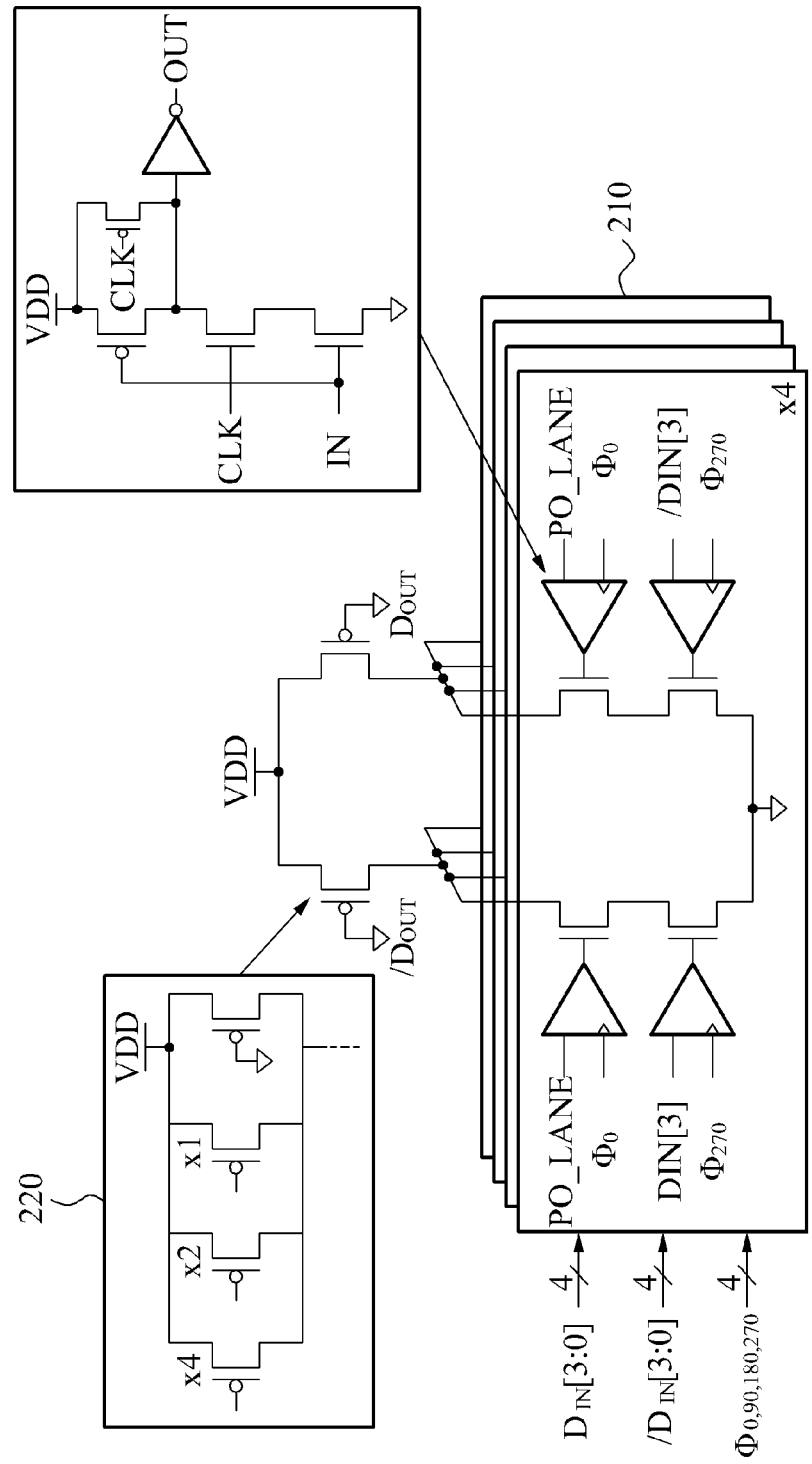
FIG. 2 is a view illustrating an example of a block diagram of a 4:1 multiplexer according to an exemplary embodiment of the present invention.

FIG. 2 is a view illustrating an example of a block diagram of a 4:1 multiplexer according to an exemplary embodiment of the present invention. For example, the 4:1 multiplexer as shown in FIG. 2 corresponds to one of the two 4:1 multiplexers 130, 140 as shown in FIG. 1. The 4:1 multiplexer may be composed of four sets of cascaded N-channel metal oxide semiconductor (NMOS) transistors 210 and adjustable pseudo P-channel metal oxide semiconductor (pseudo-PMOS) loads 220 for swing and common mode control. Each of the cascaded NMOS transistors 210 may be driven by differential input data and two neighboring quarter phase clock signals among multiphase clock signals from a clock distributor 150 as shown in FIG. 1.

Figure 3:
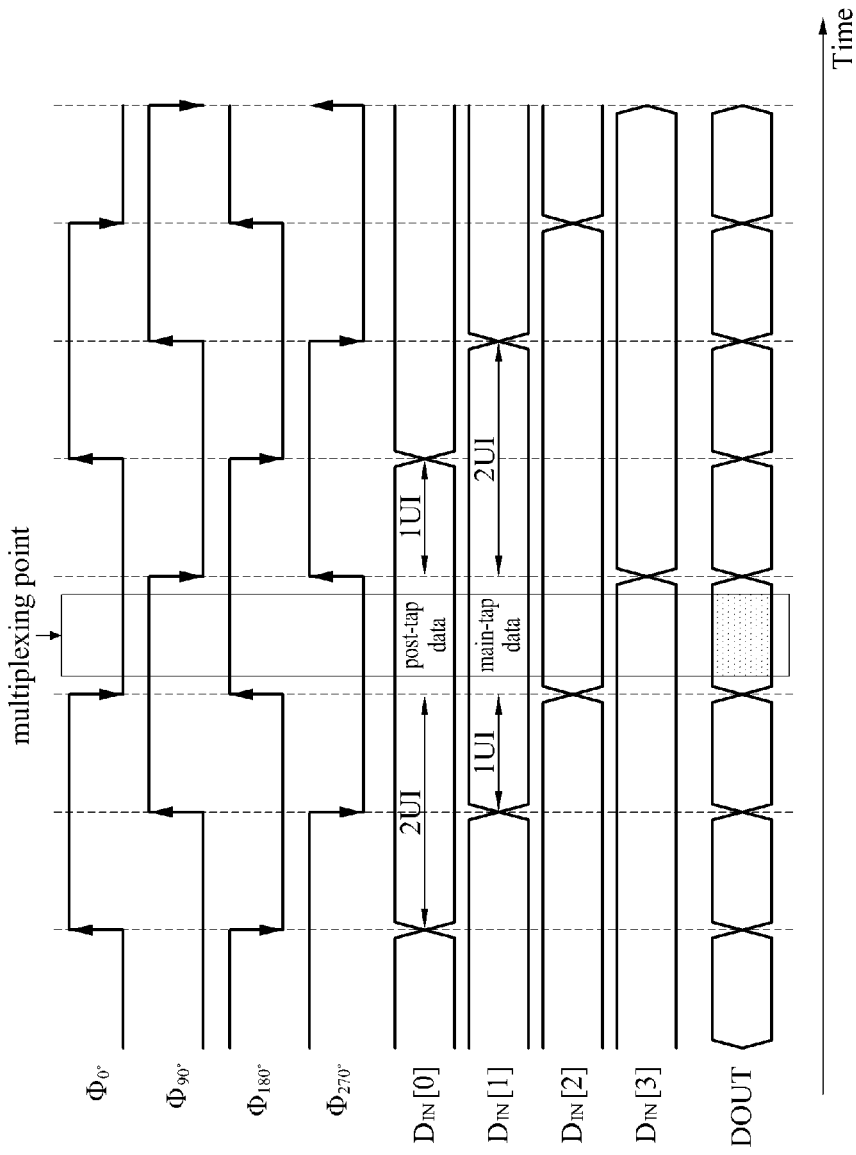
FIG. 3 is a view illustrating an example of a timing diagram of 4:1 multiplexer according to an exemplary embodiment of the present invention.

FIG. 3 is a view illustrating an example of a timing diagram of 4:1 multiplexer according to an exemplary embodiment of the present invention. An output of the 4:1 multiplexer may be evaluated when two neighboring quarter phase clock signals overlap. Thus, a bandwidth requirement of the clock signal path may be relaxed by a factor of the overlapped two signals. Current sources may be eliminated to enhance the bandwidth of the 4:1 multiplexer. The interstage retimer 120 as shown in FIG. 1 may be inserted prior to the two 4:1 multiplexers 130, 140 to provide a sufficient timing margin between the parallel data and the multiphase clock signals.

Referring to FIG. 1, the two 4:1 multiplexers 130, 140 may directly drive the output drivers 180, 190 without extra CML buffer stages, which lead to dispersion due to band-limitation at outputs of the two 4:1 multiplexers 130, 140. However, the dispersion may be compensated simultaneously together with the channel dispersion by using the pre-emphasis filter provided that the internal dispersion is linear. In order to accomplish the forementioned simultaneous dispersion compensation, the pre-emphasis filter is not inserted subsequent to the output of the two 4:1 multiplexers 130, 140 unlike conventional designs. Whereas, a final stage of the transmitter consists of the two 4:1 multiplexers 130, 140 followed by current summing CML output drivers 160, 170 terminated with 50Ω resistors. Because a typical CML-based 50Ω driver has sufficient linearity, the channel dispersion and internal band-limitation can be combined linearly.

Figure 4:
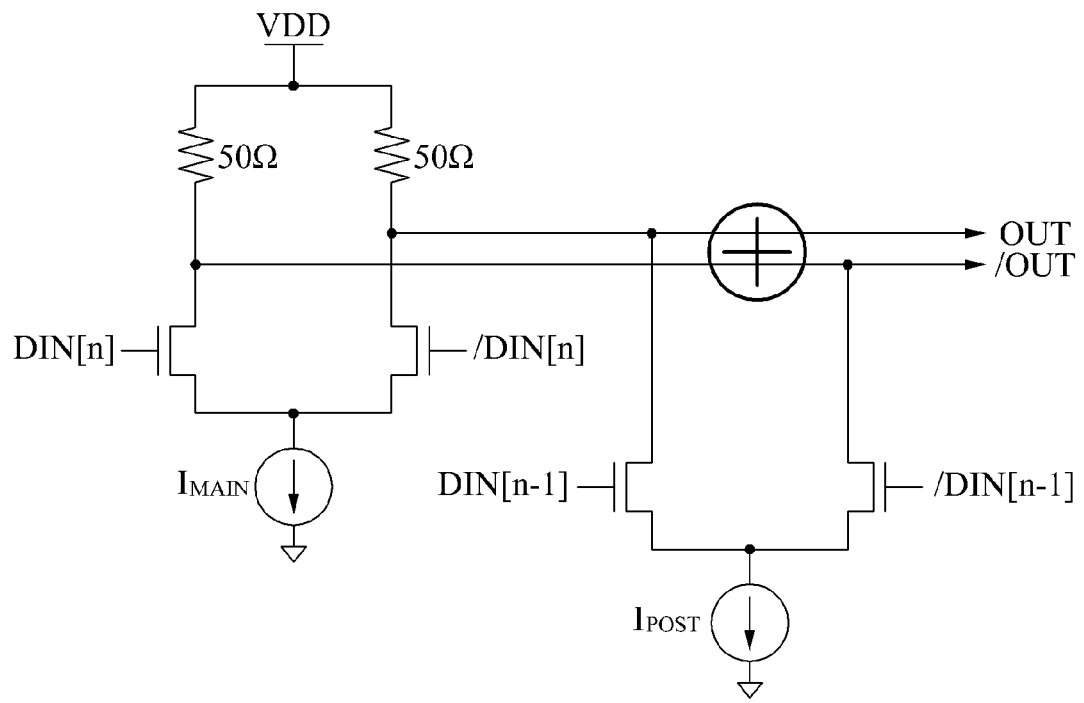
FIG. 4 is a view illustrating an example of a main driver and a post driver according to an exemplary embodiment of the present invention.

FIG. 4 is a view illustrating an example of a main driver and a post driver according to an exemplary embodiment of the present invention. Amount of pre-emphasis is controlled by adjusting the bias current of the CML driver in the secondary path by post driver. A size of the transistors in the secondary path is determined based on the required pre-emphasis tap weights for the channel loss compensation. Additional dispersion caused by the secondary 4:1 multiplexer 140 is negligibly small compared to the main signal at the final output stage in a moderately dispersed system.

The exemplary embodiments according to the present invention may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A transmitter comprising:
   a main multiplexer configured to generate a main data signal by multiplexing parallel signals and to output the main data signal, when two neighboring quarter phase clock signals among multiphase clock signals overlap, wherein the main multiplexer comprises a plurality of cascaded N-channel metal oxide semiconductor (NMOS) transistors and adjustable pseudo P-channel metal oxide semiconductor (pseudo-PMOS) loads and the cascaded NMOS transistors are driven by differential input data and the two neighboring quarter phase clock signals;
   a secondary multiplexer configured to generate a post data signal by multiplexing the parallel signals and to output the post data signal when the two neighboring quarter phase clock signals overlap; and
   a main driver and a post driver configured and arranged for receiving the main data signal and the post data signal, respectively,
   wherein an output of the main driver associated with an input DIN[n] of the main driver is connected with an output of the post driver associated with a differential input /DIN[n−1] of the post driver to generate a first output /OUT, and an output of the main driver associated with an input /DIN[n] of the main driver is connected with an output of the post driver associated with a differential input DIN[n−1] of the post driver to generate a second output OUT,
   wherein a pre-emphasized output signal is generated by summing the first output /OUT and the second output OUT.

2. The transmitter of claim 1, further comprising:
   a multiplexer configured to generate the parallel signals for the main multiplexer and the secondary multiplexer by multiplexing parallel input data signals.

3. The transmitter of claim 2, further comprising:
   a retimer configured to process retiming the parallel signals generated by the multiplexer for providing a timing margin between the parallel signals and the multiphase clock signals from a clock distributor.

4. The transmitter of claim 2, wherein the multiplexer comprises a plurality of 5:1 multiplexers and a plurality of 2:1 multiplexers.

5. The transmitter of claim 1, wherein a size of the cascaded NMOS transistors is determined based on required pre-emphasis tap weights for the channel loss compensation.

6. The transmitter of claim 5, wherein the secondary multiplexer comprises a plurality of cascaded N-channel metal oxide semiconductor (NMOS) transistors, and
   wherein a size of the cascaded NMOS transistors of the secondary multiplexer is smaller than the size of the cascaded NMOS transistors of the main multiplexer.

7. The transmitter of claim 1, wherein an amount of pre-emphasis is controlled by adjusting the bias current of a post driver included in the plurality of output drivers.

* * * * *